United States Patent
Warner (10) Patent No.: US 7,514,982 B2
(45) Date of Patent: Apr. 7, 2009

(54) METHODS, DEVICES AND SYSTEMS FOR SENSING THE STATE OF FUSE DEVICES

(75) Inventor: David J. Warner, Addlestone (GB)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 11/513,457

(22) Filed: Aug. 31, 2006

(65) Prior Publication Data

US 2008/0055977 A1    Mar. 6, 2008

(51) Int. Cl.
*H01H 37/76* (2006.01)

(52) U.S. Cl. .................................. 327/525; 327/526

(58) Field of Classification Search .............. 327/525, 327/526; 348/159; 365/225.7
See application file for complete search history.

(56) References Cited

U.S. PATENT DOCUMENTS

| 5,345,110 | A |   | 9/1994  | Renfro et al. |
|-----------|---|---|---------|---------------|
| 5,731,733 | A |   | 3/1998  | Denham |
| 5,789,970 | A | * | 8/1998  | Denham ........... 327/525 |
| 6,157,583 | A |   | 12/2000 | Starnes et al. |
| 6,618,311 | B1|   | 9/2003  | Becker |
| 6,670,843 | B1| * | 12/2003 | Moench et al. ........ 327/525 |
| 6,906,557 | B1|   | 6/2005  | Parker et al. |
| 6,995,601 | B2|   | 2/2006  | Huang et al. |
| 7,023,031 | B2| * | 4/2006  | Tsai ................... 257/209 |
| 2005/0151578 | A1 | | 7/2005 | Huang et al. |

FOREIGN PATENT DOCUMENTS

| EP | 0 252 325 B1 | 6/1987 |
| EP | 1 039 478 A1 | 2/2000 |

* cited by examiner

*Primary Examiner*—Vu A Le
(74) *Attorney, Agent, or Firm*—WraskBritt (57) ABSTRACT

A fuse sensing circuit includes a sense controller and a fuse state sensor. The sense controller includes a reference fuse and a reference sensor coupled to the reference fuse. The reference sensor generates a sample clock with a certain threshold transition characteristic in response to the assertion of a sense input by detecting a programming state of the reference fuse. The fuse state sensor includes a sample fuse, a fuse sensor coupled to the sample fuse, and a flip-flop. The sample fuse is configured to generate a data signal indicative of a programming state of the sample fuse when an enable input is asserted and the sense input is asserted. The flip-flop is configured to sample the data signal using the threshold transition characteristic on an assertion edge of the sample clock. The fuse sensing circuit may be included in an image sensor or an imaging system.

27 Claims, 4 Drawing Sheets

METHODS, DEVICES AND SYSTEMS FOR SENSING THE STATE OF FUSE DEVICES

BACKGROUND OF THE INVENTION

1. Field of the Invention

Embodiments of the present invention relate generally to semiconductor circuits containing fuse devices and, more specifically, to detection of a programming state of the fuse devices.

2. State of the Art

In integrated circuits it may be desirable to include a way to permanently store information about the integrated circuit. Fuses are often used to perform this function, wherein the fuse may be left unblown or the fuse may be blown. Some fuses may be blown with an electrical current while other fuses may be blown (or trimmed) with a laser. With this permanent information storage capability, semiconductor devices may be configured in different ways. For example, memories, such as Dynamic Random Access Memories, Static Random Access Memories, and Flash memories may have memory cells that are defective or do not meet performance standards. These defective memory cells may be bypassed and a substitution of spare memory cells may be made based on the programming of the fuse elements. Similarly, image sensors may include defective pixels, which may be compensated for based on the programming of the fuse elements.

Once the desired state of fuses on an integrated circuit is determined, the fuses may be programmed appropriately. It is useful to verify and sense the value of the programmed fuse both in operational modes and to verify that the fuse has been programmed successfully.

Many methods for sensing the programming state of fuse devices have been proposed. However, as semiconductor processing changes, these sensing methods have become more complex to implement. With the complexity, comes the requirement for increased die space for the sensing operation and, in many cases, increased power demand to perform the sensing operation.

DETAILED DESCRIPTION OF THE INVENTION

There is a need for new fuse sensing techniques. Embodiments of the present invention provide methods and apparatuses for a new way to sample the programming state of fuses.

Figure 1:
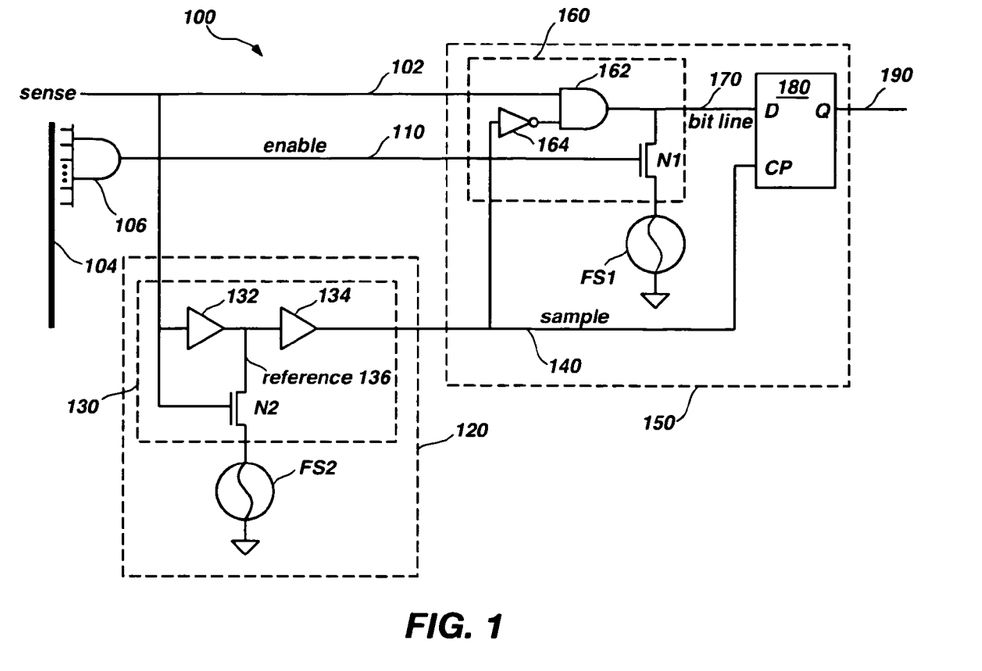
FIG. 1 is a circuit diagram of a fuse sensing circuit in accordance with an embodiment of the invention.
Figure 3:
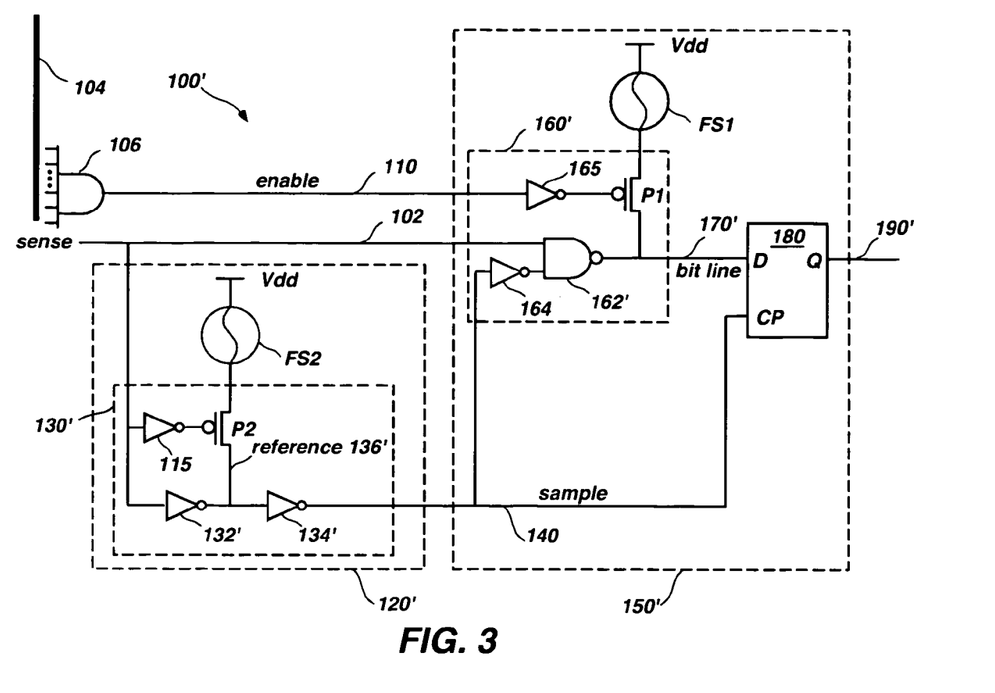
FIG. 3 is a circuit diagram of a fuse sensing circuit in accordance with another embodiment of the invention.

Embodiments of the invention, as illustrated in FIGS. 1 and 3, include a fuse sensing circuit comprising a sense controller and a fuse state sensor. The sense controller includes a reference fuse and a reference sensor operably coupled to the reference fuse. The reference sensor is configured to generate a sample clock with a certain threshold transition characteristic in response to the assertion of a sense input by detecting a programming state of the reference fuse. The fuse state sensor includes a sample fuse, a fuse sensor operably coupled to the sample fuse, and an edge-sensitive state device. The sample fuse is configured to generate a data signal indicative of a programming state of the sample fuse when an enable input is asserted and the sense input is asserted. The edge-sensitive state device is configured to sample the data signal using the threshold transition characteristic on an assertion edge of the sample clock.

Another embodiment of the invention, as illustrated in FIGS. 1 and 3, includes a fuse sensing circuit comprising a sense controller and a fuse state sensor. The sense controller includes a reference fuse including a first terminal operably coupled to a reference supply. A reference control gate is operably coupled in series between a second terminal of the reference fuse and a reference signal and is configured to conduct when a sense input is asserted. An input buffer is configured to drive an asserted level on the reference signal when the sense input is asserted. A reference buffer, operably coupled to the reference signal, and including a threshold transition characteristic, is configured to generate a sample clock correlated to the reference signal.

The fuse state sensor includes a sample fuse including a first terminal operably coupled to the reference supply. A sample control gate operably couples in series between a second terminal of the sample fuse and a data signal and is configured to conduct when an enable input is asserted. A data signal driver is configured to drive an asserted level on the data signal when the sense input is asserted and the sample clock is negated. An edge-sensitive state device is configured to drive a sensed output and includes an input, which includes the threshold transition characteristic, which is operably coupled to the data signal, and a clock input, which is operably coupled to the sample clock.

Figure 5:
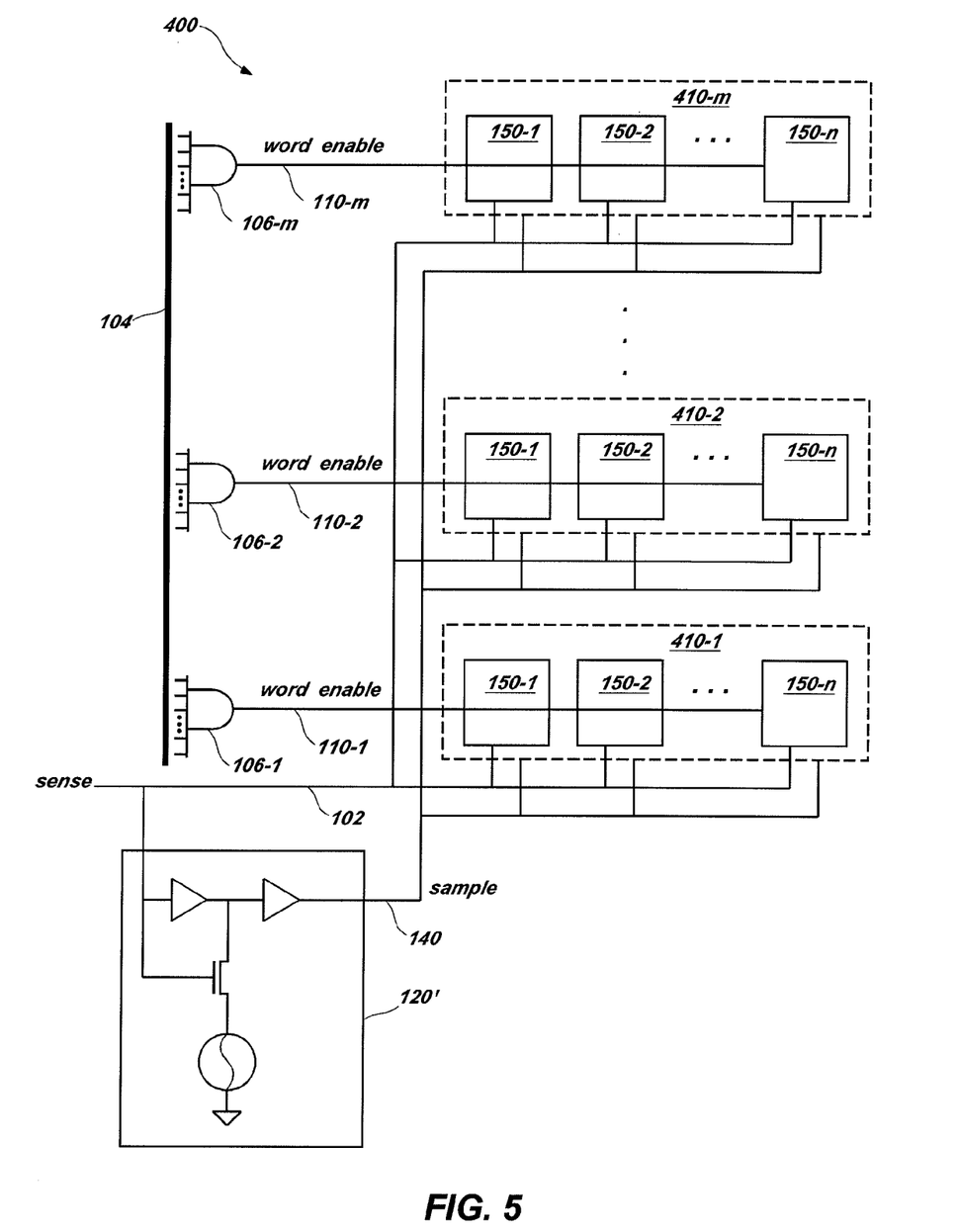
FIG. 5 is a block diagram of an array of fuse sensing circuits in accordance with another embodiment of the invention.

Another embodiment of the invention, as illustrated in FIG. 5, comprises a fuse sensing array including a sense controller according to an embodiment described above and at least one fuse register. Each fuse register includes an address decoder configured to assert an enable input for the fuse register when an address input is in a state for selecting the fuse register. Each fuse register also includes at least one fuse state sensor according to an embodiment described above.

Another embodiment of the invention includes a method for determining a programming state of a fuse, as illustrated in FIGS. 1-4. The method includes asserting a sample clock with a threshold transition characteristic in response to the assertion of a sense input by detecting a programming state of a reference fuse. The method further includes generating a data signal indicative of a programming state of a sample fuse when an enable input is asserted, the sense input is asserted, and the sample clock is negated. The method also includes sampling the data signal using the threshold transition characteristic on an assertion edge of the sample clock.

Figure 6:
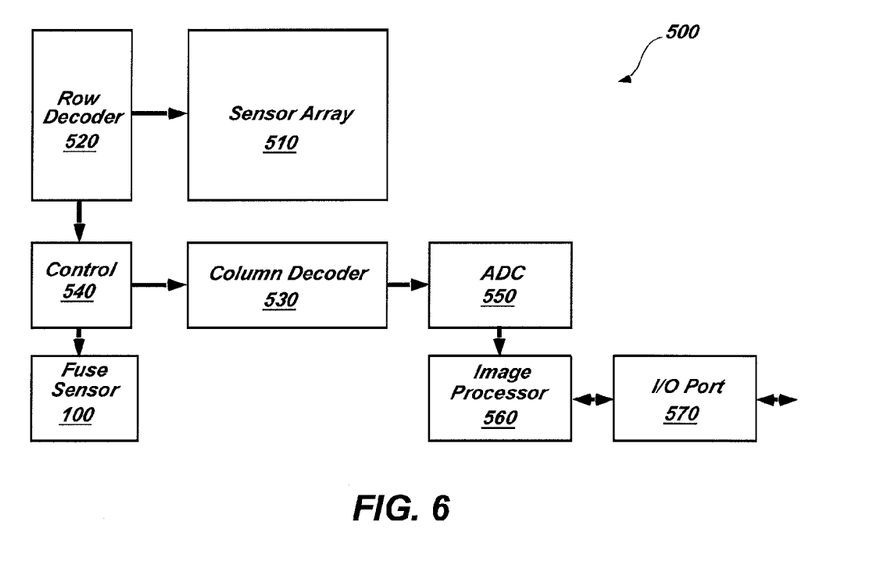
FIG. 6 is a block diagram of an image sensor including a fuse sensing circuit in accordance with embodiments of the invention.

Another embodiment of the invention, as illustrated in FIG. 6, comprises an image sensor including an array of pixels arranged on a semiconductor device wherein each pixel is configured for sensing light incident on the pixel. The image sensor also includes a fuse sensing circuit on the semiconductor device according to an embodiment for the fuse sensing circuit described above.

Figure 7:
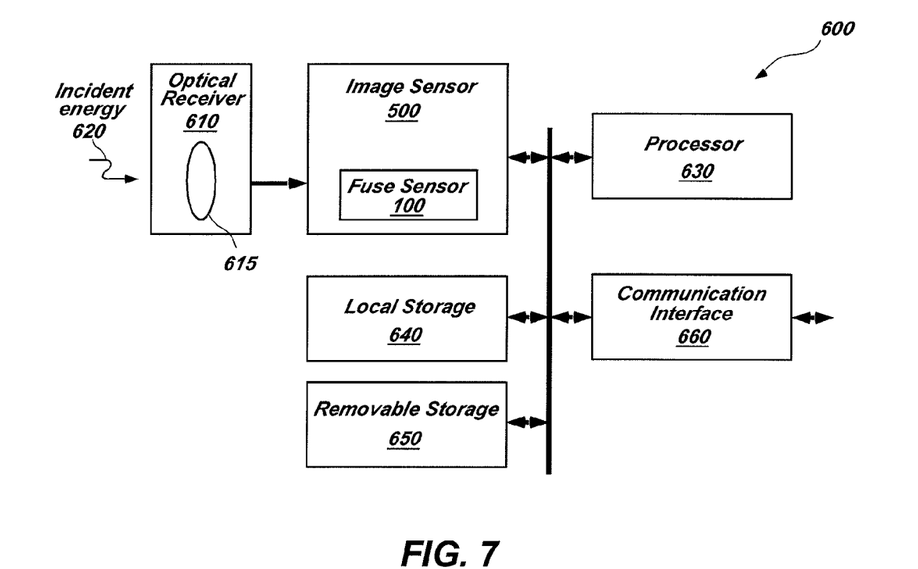
FIG. 7 is an imaging system diagram including an image sensor containing a fuse sensing circuit in accordance with embodiments of the invention.

Another embodiment of the invention, as illustrated in FIG. 7, comprises an imaging system including a processor and an embodiment of the image sensor described above.

The following provides a more detailed description of various embodiments of the present invention. In this description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block partitioning is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

In this description, some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal. Furthermore, the terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Different types of fuses may be used to implement the present invention, such as, for example, electrically programmable fuses and laser programmable fuses. Implementation and programming of these fuses is generally well known in the art and therefore is not described in further detail herein. For ease of description and clarity, the fuses may be referred to herein by various names such as fuses, fuse elements, and nonvolatile programming elements. Furthermore, the programming state of the fuses may be referred to as "unprogrammed," "unblown," or "intact," prior to programming and "programmed" or "blown" after programming.

FIG. 1 is a circuit diagram of a fuse sensing circuit 100 in accordance with an embodiment of the invention. This fuse sensing circuit 100 includes a sense controller 120 and a fuse state sensor 150. The sense controller 120 includes a reference fuse FS2 and a collection of circuitry connected to the reference fuse FS2 that may be referred to as a reference sensor 130. Within the reference sensor 130 is an input buffer 132 coupled between a sense input 102 and a reference signal 136. A reference buffer 134 is coupled between the reference signal 136 and a sample clock 140. A reference control gate N2, with its gate coupled to the sense input 102, is coupled between the reference signal 136 and the reference fuse FS2.

The reference fuse FS2 is coupled between ground on one side and a source of the reference control gate N2 on the other side. The reference fuse FS2 is a dummy fuse that is blown to create a reference for how the circuitry will respond to a blown fuse.

The fuse state sensor 150 includes a sample fuse FS1, an edge-sensitive state device 180, and a collection of circuitry connected to the sample fuse FS1 that may be referred to as a fuse sensor 160. Within the fuse sensor 160 are a sample control gate N1, an inverter 164, and a data signal driver 162 configured as a two-input AND gate. The sample clock 140 drives the inverter 164, which in turn drives one input of the data signal driver 162. The other input of the data signal driver 162 is driven by the sense input 102. The output of the data signal driver 162 drives a bit line 170, which may also be referred to as a data signal 170.

The sample fuse FS1 is coupled between ground on one side and a source of the sample control gate N1 on the other side. The sample control gate N1 has its gate coupled to the enable input 110 and is coupled between the sample fuse FS1 and the bit line 170. The sample fuse FS1 may be in a blown or unblown state depending on the desired programming state for that particular fuse.

The edge-sensitive state device 180 samples the value on the bit line 170 on an assertion edge of the sample clock 140. The edge-sensitive state device 180 may be any device suitable for sampling an input signal on an assertion edge of a clock input, such as, for example, a flip-flop. The sampled value is output from the edge-sensitive state device 180 as a sensed output 190.

To control selection of the fuse sensing circuit 100, an address decoder 106 may couple to an address bus 104 to decode a specific address for selecting this fuse sensing circuit 100 by asserting the enable input 110 when the proper address is present on the address bus 104. For simplicity, the address decoder 106 is illustrated as a multi-input AND gate; however, many other address decoding circuits, as are well known in the art, may be used.

It will be readily apparent to those of ordinary skill in the art that the reference control gate N2 and sample control gate N1 are configured as pass gates coupled to their respective fuses. While for the embodiment illustrated in FIG. 1 an N-channel pass gate may be used, other forms of pass gates may also be used. By way of example, and not limitation, the reference control gate N2 and sample control gate N1 may be in the form of a P-channel pass gate, or a parallel pass gate configured with an N-channel transistor and P-channel transistor (i.e., a CMOS pass gate), with the appropriate polarities for a control signal on the gates of the transistors, as is well known in the art.

Figure 2:
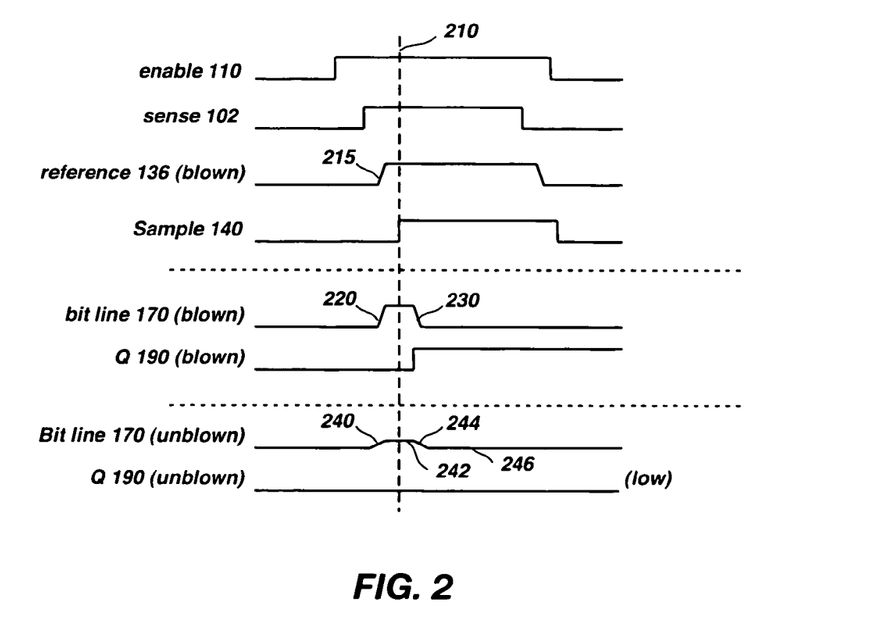
FIG. 2 is a timing diagram illustrating timing of some signals from the embodiment of FIG. 1.

FIG. 2 is a timing diagram illustrating timing of some signals from the embodiment of FIG. 1. In describing operation and timing of the FIG. 1 embodiment, reference will be made to both FIGS. 1 and 2. To begin operation, the enable input 110 is asserted when a proper address appears on the address bus 104. As a result, the sample control gate N1 is conducting such that there will be a high impedance path between ground and the bit line 170 if the sample fuse FS1 is blown, or a low impedance path between ground and the bit line 170 if the sample fuse FS1 is unblown. The sense input 102 is not asserted, so the output of data signal driver 162 is low. As a result, there is no current flow through sample control gate N1 and sample fuse FS1 at this time.

Next, the sense input 102 is asserted, indicating that a programming state of the sample fuse FS1 should be sensed and latched into the edge-sensitive state device 180.

With the assertion of the sense input 102, the data signal driver 162 drives a high level on its output. FIG. 2 includes a section indicating how the bit line 170 will respond for a blown fuse and another section indicating how the bit line 170 will respond for an unblown fuse. For a blown fuse, rising edge 220 illustrates that the bit line 170 will achieve a substantially high level because the data signal driver 162 can easily overdrive the high impedance path through the blown sample fuse FS1 and sample control gate N1. For an unblown fuse, rising edge 240 illustrates that the bit line 170 will only rise a small amount because the data signal driver 162 cannot overdrive the low impedance path through the unblown sample fuse FS1 and sample control gate N1.

Within the sense controller 120, the asserted sense input 102 causes the reference control gate N2 to conduct and causes the input buffer 132 to drive a high level on its output. Since the reference fuse FS2 is a blown fuse, with a high impedance, the path from ground, through the reference fuse FS2, through the reference control gate N2, and onto the reference signal 136, is a high impedance path. As a result, the input buffer 132 can easily overdrive this high impedance path and the reference signal 136 goes high as indicated by rising edge 215. The rising edge 215 on the reference signal 136 causes the reference buffer 134 to drive the sample clock 140 with an assertion edge 210, which in this embodiment is a rising edge.

The reference buffer 134 includes a threshold transition characteristic, which is substantially similar to the threshold transition characteristic of the D-input of the edge-sensitive state device 180. As a result, the input of the reference buffer 134 responds to transitions on the reference signal 136 in a manner substantially similar to how the D-input of the edge-sensitive state device 180 responds to transitions on the bit line 170. This similarity enables the sample clock 140 to be generated with timing such that a proper logic value will be present and stable at the D-input of the edge-sensitive state device 180 prior to the assertion edge 210 of the sample clock 140.

With the assertion edge 210 of the sample clock 140, the edge-sensitive state device 180 will sample the value on the bit line 170 and present the sampled value on the sensed output 190. In the case of a blown sample fuse FS1 the sensed output 190 will go high. In the case of an unblown sample fuse FS1, the sensed output 190 will remain low. Of course, while not illustrated, the edge-sensitive state device 180 may include a reset input to ensure that the sensed output 190 is in a properly initialized state and so the edge-sensitive state device 180 may be reset if a subsequent sense operation is to be performed.

In addition, with the sample clock 140 high, the inverter 164 drives a low as an input to the data signal driver 162, causing the bit line 170 to go low as is illustrated by falling edge 230 for a blown fuse and falling edge 244 for an unblown fuse. In the case of an unblown fuse, there is a high-current state, at location 242 wherein the high current is caused by the data signal driver 162 driving the low impedance path to ground through the unblown sample fuse FS1. However, embodiments of the present invention limit the duration of this high-current state to a very short time only long enough to ensure that a proper value on the bit line 170 is clocked into the edge-sensitive state device 180. Thus, falling edge 244 returns the bit line 170 to a low-current state 246. This self-timed sensing operation ensures that the power used to read the fuses is minimized, and is not dependent on the sense input 102 remaining in an asserted state.

Of course, the term "high-current state" as used herein is not meant to imply that the fuse sensing circuit 100 may draw large or excessive currents during this state, rather it is used herein simply to indicate that the high-current state may draw more current than the low-current state and embodiments of the present invention reduce the overall power requirements by limiting the time period in a high-current state.

Embodiments of the present invention may be implemented with the reference fuse and sense fuse coupled to a power supply (Vdd) signal rather than ground. FIG. 3 is a circuit diagram of a fuse sensing circuit 100' in accordance with such an embodiment. This fuse sensing circuit 100' includes a sense controller 120' and a fuse state sensor 150'. The sense controller 120' includes a reference fuse FS2 and a collection of circuitry connected to the reference fuse FS2 that may be referred to as a reference sensor 130'. Within the reference sensor 130' an input buffer 132' is coupled between a sense input 102 and a reference signal 136'. A reference buffer 134' is coupled between the reference signal 136' and a sample clock 140. A reference control gate P2, with its gate coupled to the sense input 102, is coupled between the reference signal 136' and the reference fuse FS2.

The reference fuse FS2 is coupled between a power supply on one side and a source of the reference control gate P2 on the other side. The reference fuse FS2 is a dummy fuse that is blown to create a reference for how the circuitry will respond to a blown fuse.

The fuse state sensor 150' includes a sample fuse FS1, an edge-sensitive state device 180, and a collection of circuitry connected to the sample fuse FS1 that may be referred to as a fuse sensor 160'. Within the fuse sensor 160' are a sample control gate P1, an inverter 164, and a data signal driver 162' configured as a two-input AND gate. The sample clock 140 drives the inverter 164, which in turn drives one input of the data signal driver 162'. The other input of the data signal driver 162' is driven by the sense input 102. The output of the data signal driver 162' drives a bit line 170', which may also be referred to as a data signal 170'.

The sample fuse FS1 is coupled between a power supply on one side and a source of the sample control gate P1 on the other side. The sample control gate P1 has its gate coupled to the enable input 110 and coupled between the sample fuse FS1 and the bit line 170'. The sample fuse FS1 may be in a blown or unblown state depending on the desired programming state for that particular fuse.

The edge-sensitive state device 180 samples the value on the bit line 170' on an assertion edge 210 (FIG. 2) of the sample clock 140. The sampled value is output from the edge-sensitive state device 180 as a sensed output 190'.

To control selection of the fuse sensing circuit 100', an address decoder 106 may couple to an address bus 104 to decode a specific address for selecting this fuse sensing circuit 100' by asserting the enable input 110 when the proper address is present on the address bus 104. For simplicity, the address decoder 106 is illustrated as a multi-input AND gate, however many other address decoding circuits, as are well known in the art, may be used.

In the embodiment of FIG. 3 the reference control gate P2 and sample control gate P1 are configured as P-channel pass gates coupled to their respective fuses. As a result, inverter 165 is connected between the enable signal and the gate of the sample control gate P1 to generate a signal with proper polarity. Of course, the enable signal may also be implemented as an active low signal eliminating the need for inverter 165. Similarly, inverter 115 is connected between the sense input 102 and the gate of the reference control gate P2. In addition, as stated earlier, other forms of pass gates may also be used.

Figure 4:
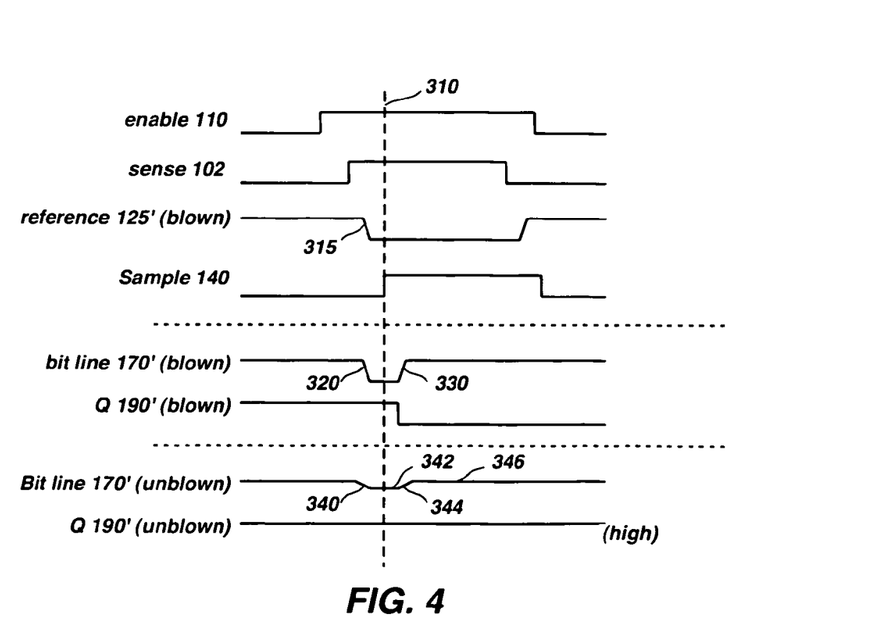
FIG. 4 is a timing diagram illustrating timing of some signals from the embodiment of FIG. 3.

FIG. 4 is a timing diagram illustrating timing of some signals from the embodiment of FIG. 3. In describing operation and timing of the FIG. 3 embodiment, reference will be made to both FIGS. 3 and 4. Operation of the FIG. 3 embodiment is mostly similar to the FIG. 1 embodiment. Therefore, only difference needed to understand the operation of FIG. 3 relative to FIG. 1 will be described.

Since the reference fuse FS2 and sense fuse FS1 are connected to a high voltage supply, the input buffer 132' and data signal driver 162' drive a low onto their respective outputs when the sense signal is asserted. Thus, the reference signal 136' transitions low 315 (FIG. 4). Similarly, for a blown fuse, falling edge 320 illustrates that the bit line 170' will achieve a substantially low level because the data signal driver 162' can easily overdrive the high impedance path through the blown sample fuse FS1 and sample control gate P1. For an unblown fuse, falling edge 340 illustrates the bit line 170' will only fall a small amount because the data signal driver 162' cannot overdrive the low impedance path through the unblown sample fuse FS1 and sample control gate P1.

With the assertion edge 310 of the sample clock 140, the edge-sensitive state device 180 will sample the value on the bit line 170' and present the sampled value on the sensed output 190'. In the case of a blown sample fuse FS1 the sensed output 190' will go low. In the case of an unblown sample fuse FS1, the sensed output 190' will remain high. Of course, while not illustrated, the edge-sensitive state device 180 may include a reset (or set) input to ensure that the sensed output 190' is in a properly initialized state and so the edge-sensitive state device 180 may be reset if a subsequent sense operation is to be performed.

In addition, with the sample clock 140 high, inverter 164 drives a low as an input to the data signal driver 162', causing the bit line 170' to go high as is illustrated by rising edge 330 for a blown sample fuse FS1 and rising edge 344 for an unblown sample fuse FS1. In the case of an unblown sample fuse FS1, there is a high-current state, at location 342 wherein the high current is caused by the data signal driver 162' driving the low impedance path to the supply voltage through the unblown sample fuse FS1. However, embodiments of the present invention limit the duration of this high-current state to a very short time, only long enough to ensure that a proper value on the bit line 170' is clocked into the edge-sensitive state device 180. Thus, rising edge 344 returns the bit line 170' to a low-current state 346.

Embodiments of the present invention may include many fuses. FIG. 5 is a block diagram of fuse array 400 in accordance with such an embodiment. In FIG. 5, a plurality of fuse state sensors (150-1, 150-2, 150-n) may be arranged to create a fuse register 410 with n bits. In addition, a plurality of fuse registers (410-1, 410-2, 410-m) may be arranged to create an array including m fuse registers 410. The fuse array 400 may use a single sample clock 140 driven by a single sense controller 120'. Each fuse register 410 may be driven from a word enable input 110 generated by an address decoder (106-1, 106-2, 106-m) for that fuse register 410. Each address decoder 106 uses the address bus 104 to decode a specific address for its corresponding fuse register 410.

The sense controller 120' illustrated in FIG. 5 includes the reference fuse connected to ground, similar to the implementation shown in FIG. 1. However, those of ordinary skill in the art will recognize that the sense controller 120' and fuse state sensors 150 may be configured as illustrated in FIG. 3, with the fuses connected to a supply voltage. Furthermore, while not illustrated, those of ordinary skill in the art will recognize that the fuse array 400 may be configured with a sense controller 120' and sample clock 140 for each fuse register 410.

FIG. 6 is a simplified block diagram of an image sensor 500 on a semiconductor device including at least one embodiment of a fuse sensing circuit 100 according to the present invention. The image sensor 500 includes a sensor array 510, a row decoder 520, a column decoder 530, and a controller 540. The sensor array 510 includes photo-sensitive devices such as photodiodes or photo-transistors fabricated on, for example, a complementary metal oxide semiconductor (CMOS) device. Each photo-sensitive device is sensitive to light in such a way that it can create an electrical current that is proportional to the intensity of light striking the photo-sensitive device. The overall image captured by the sensor array 510 includes many pixels arranged in an array such that each pixel detects the light intensity at the location of that pixel.

The pixels of the sensor array 510 are arranged in individually addressable rows and columns such that the row decoder 520 can address each row of the sensor array 510 and the column decoder 530 can address each column of the sensor array 510.

While not illustrated with connections, it will be understood by those of ordinary skill in the art that the controller 540 may control functions of many or all of the other blocks within the image sensor 500. For example, the controller 540 may control the exposure of the sensor array 510 (i.e., capturing an image) and the sequencing of the row decoder 520 and column decoder 530 to read out the analog values at each pixel location within the sensor array 510. In addition, the controller 540 may control reading of the fuse values from the fuse sensor 100. By way of example only, and not limitation, the fuses may be used to store information about locations of defective pixels in the sensor array 510.

As the pixels are each individually addressed, the resulting analog signal from each pixel may be sequentially directed from the column decoder 530 to an analog-to-digital converter 550. The analog-to-digital converter 550 converts the analog signal for each pixel to a digital signal representing the intensity of light at that pixel.

The digital signal for each pixel may be directed through an image processor 560. The image processor 560 may perform a number of functions on the pixel being processed. By way of example, and not limitation, if a pixel is identified by fuse programming to be defective, the value for the pixel may be replaced with a new value. For example, the value may be replaced by the value of a neighboring pixel or an average value from a number of neighboring pixels. After processing, the current pixel may be transferred to the input/output (I/O) port 570 for transmission out of the image sensor 500.

FIG. 7 is a simplified block diagram of an imaging system 600. The imaging system 600 includes an image sensor 500 containing at least one embodiment of a fuse sensing circuit 100 according to the present invention. The imaging system 600 may also include a processor 630 and memory (640 and 650) in the form of local storage 640 and removable storage 650. It should be understood that the local storage 640 might comprise a wide variety of devices including, for example, Static RAM (SRAM), dynamic RAM (DRAM), and Flash memory devices. In addition, it should be understood that the removable storage 650 may comprise a wide variety of devices including, for example, Flash memory, magnetic recording media and optical recording media.

The processor 630 may perform a variety of control and signal processing functions. By way of example, and not limitation, some of these functions may be: sending and receiving control information between the processor 630 and image sensor 500, receiving digital representations of images from the image sensor 500, storing digital representations in the memory (640 and 650), performing signal processing operations on the digital representations, and controlling other operations within the imaging system 600.

The imaging system 600 may also include an optical receiver 610 for channeling, focusing, or modifying incident energy 620, being visible light in one case, to present an optical image to the image sensor 500. For example, the optical receiver 610 may include a lens 615 for focusing the incident energy 620 onto the image sensor 500.

The imaging system 600 may include a communication interface 660 for transmitting and receiving data. The communication interface 660 may be used to transfer the digital representations, or other information, between the imaging system 600 and external devices (not shown). Any suitable communication interface 660 and communication protocol may be used, such as, for example, IEEE 1394, universal serial bus (USB), and wireless communications such as cellular phones, and 802.11 protocols.

Without being limiting, such imaging systems 600 may include cellular phones, digital still cameras, digital video cameras, personal digital assistants, computer systems, scanners, machine vision systems, videophones, surveillance systems, auto focus systems, image stabilization systems, and data compression systems.

While the description herein specifically refers to embodiments of the invention within image sensor devices, those of ordinary skill in the art will recognize that embodiments of the invention may be practiced in many semiconductor devices, such as, for example, Flash memory devices, static random access memories, dynamic random access memories, microprocessors, and microcontrollers.

Although this invention has been described with reference to particular embodiments, the invention is not limited to these described embodiments. Rather, the invention is limited only by the appended claims, which include within their scope all equivalent devices or methods that operate according to the principles of the invention as described.

The invention claimed is:

1. A fuse sensing circuit, comprising:
    a sense controller, comprising:
        a reference fuse; and
        a reference sensor operably coupled to the reference fuse and configured to generate a sample clock with a threshold transition characteristic in response to an assertion of a sense input by detecting a programming state of the reference fuse; and
    a fuse state sensor, comprising:
        a sample fuse;
        a fuse sensor operably coupled to the sample fuse and configured to generate a data signal indicative of a programming state of the sample fuse when an enable input is asserted and the sense input is asserted; and
        an edge-sensitive state device configured to sample the data signal using the threshold transition characteristic on an assertion edge of the sample clock.

2. The fuse sensing circuit of claim 1, wherein the fuse sensor is further configured to operate in a low-current state when the sense input is negated.

3. The fuse sensing circuit of claim 1, wherein the fuse sensor is further configured to operate in a low-current state after the sample clock is asserted.

4. The fuse sensing circuit of claim 1, further comprising an address decoder configured to assert the enable input when an address input is in a state for selecting the fuse state sensor.

5. The fuse sensing circuit of claim 1, wherein the reference fuse and the sample fuse are operably coupled to a ground.

6. The fuse sensing circuit of claim 1, wherein the reference fuse and the sample fuse are operably coupled to a power supply.

7. A fuse sensing circuit, comprising:
    a sense controller, comprising:
        a reference fuse; and
        a reference sensor operably coupled to the reference fuse configured to generate a sample clock with a threshold transition characteristic in response to an assertion of a sense input by detecting a programming state of the reference fuse; and
    at least one fuse register, wherein each fuse register comprises:
        an address decoder configured to assert an enable input for the fuse register when an address input is in a state for selecting the fuse register; and
        at least one fuse state sensor, wherein each fuse state sensor comprises:
            a sample fuse;
            a fuse sensor operably coupled to the sample fuse and configured to generate a data signal indicative of a programming state of the sample fuse when the enable input is asserted and the sense input is asserted; and
            an edge-sensitive state device configured to sample the data signal using the threshold transition characteristic on an assertion edge of the sample clock.

8. The fuse sensing circuit of claim 7, wherein the fuse sensor is further configured to enter a low-current state after the sample clock is asserted.

9. The fuse sensing circuit of claim 7, wherein the reference fuse and each sample fuse of each fuse register are operably coupled to a ground.

10. The fuse sensing circuit of claim 7, wherein the reference fuse and each sample fuse of each fuse register are operably coupled to a power supply.

11. A fuse sensing circuit, comprising:
    a sense controller comprising:
        a reference fuse including a first terminal operably coupled to a reference supply;
        a reference control gate operably coupled in series between a second terminal of the reference fuse and a reference signal and configured to conduct when a sense input is asserted;
        an input buffer configured to drive an asserted level on the reference signal when the sense input is asserted; and
        a reference buffer operably coupled to the reference signal, including a threshold transition characteristic, and configured to generate a sample clock correlated to the reference signal; and
    a fuse state sensor, comprising:
        a sample fuse including a first terminal operably coupled to the reference supply;
        a sample control gate operably coupled in series between a second terminal of the sample fuse and a data signal and configured to conduct when an enable input is asserted;
        a data signal driver configured to drive an asserted level on the data signal when the sense input is asserted and the sample clock is negated; and
        an edge-sensitive state device configured to drive a sensed output and comprising:
            an input operably coupled to the data signal and including the threshold transition characteristic; and
            a clock input operably coupled to the sample clock.

12. The fuse sensing circuit of claim 11, further comprising an address decoder configured to assert the enable input when an address input is in a state for selecting the fuse state sensor.

13. The fuse sensing circuit of claim 11, wherein the reference supply is a ground.

14. The fuse sensing circuit of claim 11, wherein the reference supply is a power supply.

15. The fuse sensing circuit of claim 11, wherein the reference control gate is selected from the group consisting of an N-channel pass gate, a P-channel pass gate, and a CMOS pass gate.

16. The fuse sensing circuit of claim 11, wherein the sample control gate is selected from the group consisting of an N-channel pass gate, a P-channel pass gate, and a CMOS pass gate.

17. A method for determining a programming state of a fuse, comprising:
- asserting a sample clock with a threshold transition characteristic in response to an assertion of a sense input by detecting a programming state of a reference fuse;
- generating a data signal indicative of a programming state of a sample fuse when an enable input is asserted, the sense input is asserted, and the sample clock is negated; and
- sampling the data signal using the threshold transition characteristic on an assertion edge of the sample clock.

18. The method of claim 17, wherein generating the data signal further comprises generating a low-current state on the data signal after the sample clock is asserted.

19. The method of claim 17, further comprising decoding an address to assert the enable input when an address input is in a state for determining the programming state of the fuse.

20. An image sensor, comprising:
- an array of pixels arranged on a semiconductor device wherein each pixel is configured for sensing light incident on the pixel; and
- a fuse sensing circuit on the semiconductor device, comprising:
  - a sense controller, comprising:
    - a reference fuse; and
    - a reference sensor operably coupled to the reference fuse and configured to generate a sample clock with a threshold transition characteristic in response to the assertion of a sense input by detecting a programming state of the reference fuse; and
  - a fuse state sensor, comprising:
    - a sample fuse;
    - a fuse sensor operably coupled to the sample fuse and configured to generate a data signal indicative of a programming state of the sample fuse when an enable input is asserted and the sense input is asserted; and
    - an edge-sensitive state device configured to sample the data signal using the threshold transition characteristic on an assertion edge of the sample clock.

21. The image sensor of claim 20, wherein the fuse sensor is further configured to enter a low-current state after the sample clock is asserted.

22. The image sensor of claim 20, further comprising an address decoder configured to assert the enable input when an address input is in a state for selecting the fuse state sensor.

23. The image sensor of claim 20, wherein the reference fuse and the sample fuse are operably coupled to a ground.

24. The image sensor of claim 20, wherein the reference fuse and the sample fuse are operably coupled to a power supply.

25. An imaging system, comprising:
- a processor; and
- an image sensor operably coupled to the processor and comprising:
  - an array of pixels arranged on a semiconductor device wherein each pixel is configured for sensing light incident on the pixel; and
  - a fuse sensing circuit on the semiconductor device, comprising:
    - a sense controller, comprising:
      - a reference fuse; and
      - a reference sensor operably coupled to the reference fuse configured to generate a sample clock with a threshold transition characteristic in response to an assertion of a sense input by detecting a programming state of the reference fuse; and
    - a fuse state sensor, comprising:
      - a sample fuse;
      - a fuse sensor operably coupled to the sample fuse and configured to generate a data signal indicative of a programming state of the sample fuse when an enable input is asserted and the sense input is asserted; and
      - an edge-sensitive state device configured to sample the data signal using the threshold transition characteristic on an assertion edge of the sample clock.

26. The imaging system of claim 25, further comprising:
- a memory configured for storing a digital representation of an image captured by the array of pixels; and
- a communication interface configured for communicating the digital representation of the image to an external device.

27. The imaging system of claim 25, further comprising an optical receiver configured to receive and modify incident light and present the modified light to the array of pixels.

* * * * *

UNITED STATES PATENT AND TRADEMARK OFFICE
CERTIFICATE OF CORRECTION

PATENT NO. : 7,514,982 B2 Page 1 of 1
APPLICATION NO. : 11/513457
DATED : April 7, 2009
INVENTOR(S) : Warner It is certified that error appears in the above-identified patent and that said Letters Patent is hereby corrected as shown below:

On the Title page, in field (74), in "Attorney, Agent, or Firm", in column 2, line 1, delete "WraskBritt" and insert -- TraskBritt --, therefor.

Signed and Sealed this

Seventh Day of July, 2009

JOHN DOLL
*Acting Director of the United States Patent and Trademark Office*